(12) United States Patent
Zhang

(10) Patent No.: US 6,759,005 B2
(45) Date of Patent: Jul. 6, 2004

(54) FABRICATION OF B/C/N/O/SI DOPED SPUTTERING TARGETS

(75) Inventor: Wenjun Zhang, Gilbert, AZ (US)

(73) Assignee: Heraeus, Inc., Chandler, AZ (US)

( * ) Notice: Subject to any disclaimer, the term of this patent is extended or adjusted under 35 U.S.C. 154(b) by 0 days.

(21) Appl. No.: 10/200,590

(22) Filed: Jul. 23, 2002

(65) Prior Publication Data

US 2004/0018110 A1 Jan. 29, 2004

(51) Int. Cl.$^7$ ................................................ B22F 3/15
(52) U.S. Cl. ........................... 419/11; 419/12; 419/13; 419/28; 419/49
(58) Field of Search .............................. 419/11, 12, 13, 419/49, 28

(56) References Cited

U.S. PATENT DOCUMENTS

| | | | | |
|---|---|---|---|---|
| 4,609,528 A | * | 9/1986 | Chang et al. | 419/62 |
| 4,612,165 A | * | 9/1986 | Liu et al. | 420/459 |
| 4,613,368 A | * | 9/1986 | Chang et al. | 75/246 |
| 4,917,722 A | * | 4/1990 | Kuniya et al. | 75/232 |
| 5,470,527 A | | 11/1995 | Yamanobe et al. | |
| 5,561,833 A | * | 10/1996 | Tomioka et al. | 419/19 |
| 5,652,877 A | | 7/1997 | Dubois et al. | 428/553 |
| 5,778,302 A | * | 7/1998 | Ivanov | 419/32 |
| 5,863,398 A | | 1/1999 | Kardokus et al. | 204/298.1 |
| 5,989,673 A | | 11/1999 | Xiong et al. | 428/65.3 |
| 6,261,984 B1 | | 7/2001 | Mochizuki et al. | 501/133 |
| 6,264,813 B1 | | 7/2001 | Leroy et al. | 204/298.13 |
| 6,328,927 B1 | * | 12/2001 | Lo et al. | 419/45 |
| 6,417,105 B1 | * | 7/2002 | Shah et al. | 438/682 |
| 6,589,311 B1 | * | 7/2003 | Han et al. | 75/245 |

FOREIGN PATENT DOCUMENTS

| | | |
|---|---|---|
| EP | 1 112 988 | 7/2001 |
| EP | 1 118 690 | 7/2001 |
| EP | 1 233 082 | 8/2002 |
| JP | 10-183341 | 7/1998 |
| WO | WO 99/19102 | 4/1999 |
| WO | WO 01/38599 | 5/2001 |

* cited by examiner

*Primary Examiner*—Ngoclan Mai
(74) *Attorney, Agent, or Firm*—McDermott, Will & Emery

(57) ABSTRACT

The present invention relates to a method of manufacturing sputtering targets doped with non-metal components including boron, carbon, nitrogen, oxygen and silicon. A powder process is utilized whereby alloyed powders, which contain non-metal elements of B/C/N/O/Si and non-metal containing phases of less than ten microns in microstructure, are blended, canned and subjected to hot isostatic press consolidation. The sputtering targets of the present invention avoid spitting problems during sputtering of the target material on a substrate.

23 Claims, 1 Drawing Sheet

Process Flow Chart for the Production of B/C/N/O/Si Doped Sputtering Targets

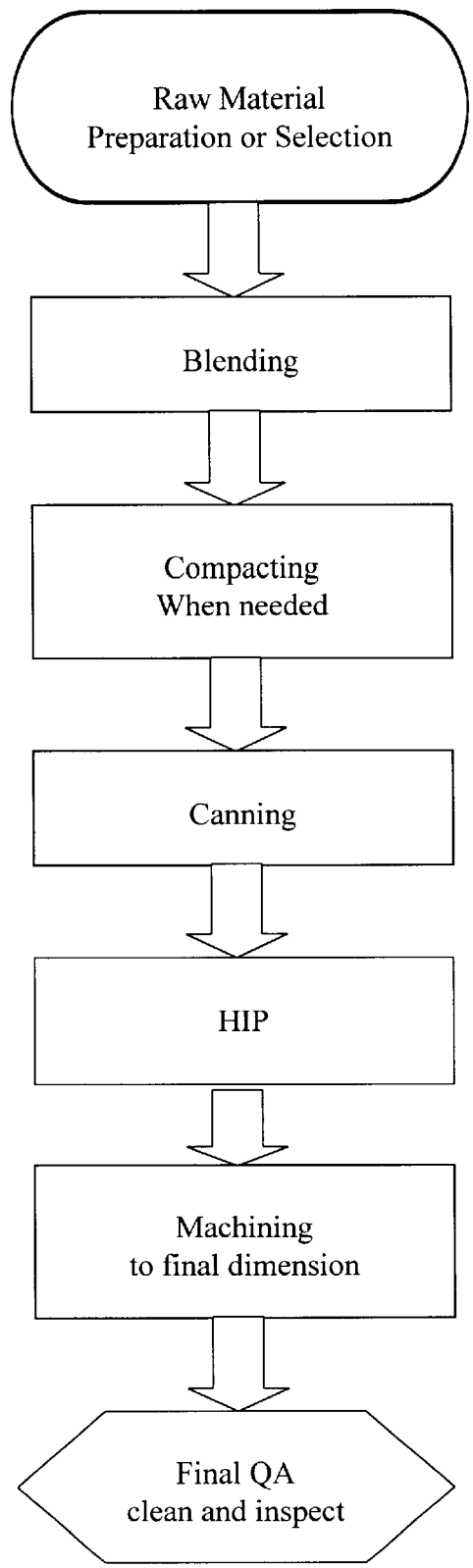
Figure 1. Process Flow Chart for the Production of B/C/N/O/Si Doped Sputtering Targets

FABRICATION OF B/C/N/O/SI DOPED SPUTTERING TARGETS

FIELD OF INVENTION

The invention is directed to a method of fabricating sputtering targets doped with non-metal additions including boron, carbon, nitrogen, oxygen and silicon by using atomized or crushed alloy powder or ultra fine boride, carbide, nitride, oxide, and silicide powder and hot isostatic pressing.

BACKGROUND OF THE INVENTION

Cathodic sputtering processes are widely used for the deposition of thin films of material onto desired substrates. A typical sputtering system includes a plasma source for generating an electron or ion beam, a target that comprises a material to be atomized and a substrate onto which the sputtered material is deposited. The process involves bombarding the target material with an electron or ion beam at an angle that causes the target material to be sputtered or eroded. The sputtered target material is deposited as a thin film or layer on the substrate.

The target materials for sputtering process range from pure metals to ever more complicated alloys. The use of complex 3 to 6 element alloys is common in the sputtering industry. Alloying additions such as boron, carbon, nitrogen, oxygen, silicon and so on are frequently added to Cr-, Co-, Fe-based alloys and other intermetallic alloys to modify characteristics such as deposited film grain-size, surface energy and magnetic properties.

The presence of non-metal additions like boron, carbon, nitrogen, oxygen and silicon to target materials is either in the form of pure elements, e.g. boron and carbon, or in the form of compounds like nitride and oxide. The pure element phases such as boron and carbon and the compound phases like boride, carbide, nitride, oxide, and silicide, however cause spitting problems during sputtering. The present invention provides a solution to this problem.

SUMMARY OF THE INVENTION

The present invention relates to a novel method of fabricating sputtering targets that are doped with non-metals such as boron, carbon, nitrogen, oxygen and silicon or mixtures thereof or compounds of non-metals. The process comprises preparation of a pre-alloyed powder or selection of ultra fine compound powder of less than 10 microns, preferably less than 5 microns and most preferably less than 2 microns. It has been discovered that spitting will not occur when the above phases are in form of ultra fine particles of less than 10 microns in size. After the ultra fine powders are blended together, the powder blend is canned, followed by a hot isostatic press (HIP) consolidation. Powder processing as above is employed to make the target materials because of unique advantages over the prior art's melting process, both technically and economically. These and other objectives of this invention will become apparent from the following detailed description.

BRIEF DESCRIPTION OF THE DRAWINGS

Reference is now made to the accompanying drawing wherein:

FIG. 1 shows the process flow chart of the invention described herein.

DETAILED DESCRIPTION OF THE INVENTION

The alloy powders of the present invention include alloys and intermetallic alloys composed of 2 to 6 elements, including but not limited to Cr-, Co-, Ru-, Ni-, or Fe-based alloys. The alloy powders contain Cr, Co, Ru, Ni, or Fe, optionally alloyed with each other, or with Cr, Al, Pt, Ta, Zr, Mo, Ti, V, or W, and include at least one non-metallic addition selected from B, C, N, O or Si.

FIG. 1 shows the process flow for making the targets. The first step is the preparation of raw material powders like atomized alloy powders of Ni—Al—B, Fe—B, Fe—C, Fe—Si and so on or the selection of commercially available ultra fine compound powders such as $Al_2O_3$, AlN, MoB and $Cr_2O_3$ of 10 microns or less. Atomized powders have very fine microstructure because of extremely quick cooling and solidification, therefore it is the first choice as raw materials. In some cases powders of fine microstructures can also be made by melting and mechanically crushing ingots much more economically than by atomization, especially for small quantities of powder. Some ultra fine compound powders like $Al_2O_3$, AlN, MoB, $Cr_2O_3$, $B_4C$ and so on are also commercially available, and therefore save both time and money for new product development. Blending of various powders together is preferable because segregation occurs quite often, especially when powders of differing particle size and gravity are combined. Special blending and homogenizing methods include ball milling, v-blending, tubular blending, and attritor milling. Therefore, it is preferred that the alloy powders and/or mixture be substantially homogeneous for best results.

Proper canning techniques are needed to avoid segregation during canning. The powders are canned in preparation for consolidation. In canning for example, a container is filled with the powder, evacuated under heat to ensure the removal of any moisture or trapped gasses present, and then sealed. Although the geometry of the container is not limited in any manner, the container can possess a near-net shape geometry with respect to the final material configuration.

The encapsulate material from the canning step is then consolidated via Hot-Isostatic-Pressing (HIP), a procedure known in the art. A HIP unit is typically a cylindrical pressure vessel large enough to house one or more containers. The inner walls of the vessel can be lined with resistance heating elements, and the pressure can be controlled by the introduction of inert gas within the container. HIP parameters including temperature, pressure and hold time will be minimized to prevent the growth of compound phases and grain size, as well as to save energy and to protect the environment. Pressures of about 5 to about 60 ksi (preferably 10–20 ksi) at temperatures between about 500° C. to about 1500° C. (preferably 600–900° C.), are typically employed to achieve appropriate densities. Depending upon the complexity of the cycle, total hold times during isostatic pressing typically vary from about 0.5 to about 12 hours. It is noteworthy that other powder consolidation techniques such as hot pressing and cold pressing can also be employed independently or in conjunction with HIP processing.

After consolidation, the solid material form (billet) is removed from the encapsulation can, and a slice of the billet can then be sent to be tested as to various properties of the billet. If desired, the billet can be subjected to optional thermo-mechanical processing to further manipulate the microstructural and macro-magnetic properties of the target. Also, the final shape and size of the sputter targets can be formed, for example, by processes such as wire EDM, saw, waterjet, lathe, grinder, mill, etc. In these steps, the target can be cleaned and subjected to a final inspection.

TABLE 1 alloys manufactured using the method described herein.

| Materials | Typical Chemistry |
|---|---|
| Co—Cr—Pt—B | Co61 at %-Cr15 at %-Pt12 at %-B12 at % |
| Co—Cr—Pt—O—Si | Co56 at %-Cr18 at %-Pt16 at %-O3.33 at %-Si1.67 at % |
| Co—Pt—B—C | Co60 at %-Pt20 at %-B16 at %-C4 at % |
| Co—Ta—N | Co50 at %-Ta50 at % doped with nitrogen of 5000 ppm |
| Co—Ta—Zr—O—Si | Co85 at %-Ta5 at %-Zr5 at %-O3.33 at %-Si-1.67 at % |
| Co—Ti—Pt—B | Co62 at %-Ti6 at %-Pt12 at %-B20 at % |
| Cr—B | Cr97 at %-B3 at % |
| Cr—Mo—B | Cr80 at %-Mo15 at %-B5 at % |
| Cr—Mo—O | Cr80 at %-Mo20 at % doped with oxygen of 6000 ppm |
| Cr—O | Cr doped with oxygen of 5000 ppm |
| Cr—Ti—B | Cr80 at %-Ti16 at %-B4 at % |
| Cr—V—O | Cr80 at %-V20 at % doped with oxygen of 4000 ppm |
| Cr—V—Zr—O | Cr79 at %-V20 at %-Zr1 at % doped with oxygen of 4000 ppm |
| Cr—W—O | Cr90 at %-W10 at % doped with oxygen of 6000 ppm |
| Cr—Zr—O | Cr99 at %-Zr1 at % doped with oxygen of 4000 ppm |
| Fe—Co—B | Fe56 at %-Co31 at %-B11 at % |
| Fe—Si—Al | Fe73 at %-Si17 at %-Al10 at % (Sendust) |
| Fe—Ta—C | Fe80 at %-Ta8 at %-C12 at % |
| Ni—Al—B | Ni50 at %-Al50 at % doped with boron of 2500 ppm |
| Ni—Al—N | Ni48 at %-Al48 at % doped with nitrogen of 4 at % |
| Ni—Al—O | Ni50 at %-Al50 at % doped with oxygen of 5000 ppm |
| Ru—Al—O | Ru50 at %-Al50 at % doped with oxygen of 5000 ppm |
| Ru—Al—N | Ru50 at %-Al50 at % doped with nitrogen of 4000 ppm |

EXAMPLES

The following examples demonstrate the present invention further, but should not be construed as a limitation of the present invention. The processes for all materials are similar with each other as shown in FIG. 1, and the main differences are various combinations of raw materials (powders).

EXAMPLE 1

Production of Cr-Mo Based Sputtering Target With Boron Content—Cr80at %-Mo15at %-B5at %

The above alloy is made with the following powder blends, (1) Cr, Mo and ultra fine MoB compound powder, and (2) Cr, Mo and pre-alloyed Cr-3.1wt % B powder that is made with a vacuum induction melter at 1730° C. and mechanically crushing cast ingots into powder at room temperature. Special attention must be paid to mixing all powders together when ultra fine compound powder like MoB is used, otherwise segregation may occur. Herewith an attritor mill or a ball mill must be used for blending from 2 to 24 hours. The HIP parameters for this kind of alloy include the temperature ranging from about 1000–1400° C., at a pressure from about 5–40 ksi and a hold time from about 1–12 hours. The cooling rate must be controlled too, otherwise the HIPed billet may crack during cooling down. A cooling rate of 3° C./min and a hold plateau at 800° C. for 6 hours is introduced to cooling phase.

EXAMPLE 2

Production of Co—Cr—Pt Based Sputtering Target With Si and O Content—Co56at %-Cr18at %-Pt16at %-O3.33at %-Si1.67at %

Two different combinations of starting powders are employed herein. The first is the combination of Co, Cr, Pt and ultra fine $SiO_2$ powder and the second is the combination of Co, Cr, Pt, atomized Co—Si pre-alloy and ultra fine $Cr_2O_3$ powder. The suicides are ultra fine and well dispersed in Co matrix of original gas-atomized Co—Si particles. Special mixing methods using an attritor mill or a ball mill for 2 to 24 hours must be employed here to mix all powders together homogeneously when ultra fine compound powders like $SiO_2$ and $Cr_2O_3$ are used, otherwise segregation may occur. The HIP parameters for this kind of alloy include the temperature ranging from about 600–1400° C., at a pressure from about 5–40 ksi and a hold time from about 1–12 hours.

EXAMPLE 3

Production of Cr—X (Wherein X is Mo, W, V, Ti, Zr, Ta, or Mixtures Thereof) Sputtering Target Doped With Oxygen—Cr80at %-Mo20at % Doped With Oxygen of 6000 ppm Regular Cr, Mo and partly oxidized Cr powder of oxygen level 15000 ppm are used to make the targets. The Cr powder of high oxygen is produced by oxidizing Cr flakes at high temperature and then subjected to mechanical crushing. In this case, only a part of the surface area of Cr powder is covered with oxides. Special attention must be paid to Cr powder of high oxygen level and mixing all powders together in this case, otherwise segregation may occur. Herewith an attritor mill or a ball mill may be used for blending from 2 to 24 hours. The HIP parameters for this kind of alloy include the temperature ranging from about 800–1400° C., at a pressure from about 5–40 ksi and a hold time from about 1–12 hours. The cooling rate must be controlled too, otherwise the HIPed billet may crack during cooling down. A cooling rate of 3° C./min and a hold plateau at 800° C. for 6 hours is introduced to cooling phase.

EXAMPLE 4

Production of NiAl Sputtering Target Doped With Boron, Oxygen or Nitrogen—Ni50at %-Al50at % Doped With Boron of 2500 ppm Gas-atomized NiAl intermetallic powder and ultra fine $Al_2O_3$ and AlN powder of less than 5 microns in diameter were taken for making NiAl sputtering targets doped with oxygen or nitrogen. Besides gas-atomized NiAl powder, boron-doped gas-atomized NiAl powder was also taken for making NiAl sputtering targets doped with boron and borides are ultra fine and well dispersed in the matrix. Conventional gas atomization methods are used to manufacture the powders. Special attention must be paid to mixing all powders together when ultra fine compound powders like $Al_2O_3$ and AlN are used, otherwise segregation may occur. Herewith an attritor mill or a ball mill may be used for blending from 2 to 24 hours. The HIP parameters for this kind of alloy include the temperature ranging from about 900–1400° C., at a pressure from about 5–40 ksi, and a hold time from about 1–12 hours. The cooling rate must be controlled too, otherwise the HIPed billet may crack during cooling down. A power-off furnace cooling and a hold plateau at 700° C. for 4 hours is introduced to cooling phase.

While this invention has been described with reference to several preferred embodiments, it is contemplated that various alterations and modifications thereof will become apparent to those skilled in the art upon a reading of the detailed description contained herein. It is therefore intended that the following claims are interpreted as including all such alterations and modifications as fall within the true spirit and scope of this invention.

I claim:

1. A method of fabricating sputter targets doped with a non-metallic addition, the method comprising the steps of
   (a) preparing or selecting raw material elemental powders or alloys which are doped with at least one non-metal, wherein the powders have microstructures of less than about 10 microns;
   (b) canning;
   (c) hot isostatic pressing; and
   (d) machining to form a sputter target.

2. The method according to claim 1, wherein the elemental powders or alloys have microstructures that are substantially homogeneous.

3. The method according to claim 1, wherein the powders have microstructures less than 5 microns.

4. The method according to claim 1, wherein the powders have microstructures less than 2 microns.

5. The method according to claim 1, wherein the hot isostatic pressing is conducted at a temperature between 500° C. to about 1500° C., a pressure between 5 to about 60 ksi and for a time between 0.5 to 12 hours.

6. The method according to claim 1, wherein the sputter target contains Fe—Co doped with boron.

7. The method according to claim 6, wherein the sputter target contains Fe56at %, Co31at %, and B11at %.

8. The method according to claim 1, wherein the sputter target material contains RuAl doped with oxygen or nitrogen.

9. The method according to claim 8, wherein the sputter target contains Ru50at %-Al50at %, doped with oxygen of 5000 ppm.

10. The method according to claim 8, wherein the sputter target contains Ru50at %-Al50at %, doped with nitrogen of 4000 ppm.

11. The method according to claim 1, wherein the sputter target material contains NiAl doped with oxygen, nitrogen or boron.

12. The method according to claim 11, wherein the sputter target material contains Ni50at %-Al50at % doped with boron of 2500 ppm.

13. The method according to claim 11, wherein the sputter target material contains Ni50at %-Al50at % doped with N4at %.

14. The method according to claim 11, wherein the sputter target material Ni50at %-Al50at % doped with oxygen of 5000 ppm.

15. The method according to claim 1, wherein the sputter target material contains Cr—Mo doped with boron or oxygen.

16. The method according to claim 15, wherein the sputter target material contains Cr80at %-Mo15at % doped with B5at %.

17. The method according to claim 15, wherein the sputter target material contains Cr80at %-Mo20at % doped with oxygen of 6000 ppm.

18. The method according to claim 1, wherein the sputter target material contains Cr—Ti doped with boron or oxygen.

19. The method according to claim 18, wherein the sputter target material contains Cr80at %-Ti16at % doped with B4at %.

20. The method according to claim 1, wherein the sputter target material contains Co—Cr—Pt doped with boron, silicon, carbon, oxygen or mixtures thereof.

21. The method according to claim 20, wherein the sputter target material contains Co61at %-Cr15at %-Pt12at % doped with B12at %.

22. The method according to claim 20, wherein the sputter target material contains Co56at %-Cr18at %-Pt16at % doped with O3.33at %-Si1.67at %.

23. The method according to claim 1, wherein the raw material powders are selected from the group consisting of Cr-, Co-, Ru-, Ni- and Fe-base alloys, optionally alloyed with each other, or with Cr, Al, Pt, Ta, Zr, Mo, Ti, V, or W, and further contains at least one non-metallic addition selected from the group consisting of B, C, N, O and Si.

* * * * *